United States Patent [19]
Li et al.

[11] Patent Number: 5,953,107
[45] Date of Patent: Sep. 14, 1999

[54] MASK PELLICLE REMOVE TOOL

[75] Inventors: Meng-Chun Li, Taipei; Hsieh-Mei Liu, Hsin-chu, both of Taiwan

[73] Assignee: Taiwan Semiconductor Manufacturing Company, Ltd., Hsin-Chu, Taiwan

[21] Appl. No.: 08/813,567

[22] Filed: Mar. 7, 1997

[51] Int. Cl.[6] .................................................. G03B 27/132
[52] U.S. Cl. .............................................. 355/77; 355/74
[58] Field of Search ........................ 29/239, 252; 355/71, 355/72, 73, 74, 75, 77; 430/5

[56] References Cited

U.S. PATENT DOCUMENTS

| | | | |
|---|---|---|---|
| 4,637,713 | 1/1987 | Shulenberger et al. | 355/76 |
| 5,311,250 | 5/1994 | Suzuki et al. | 355/76 |
| 5,422,704 | 6/1995 | Sego | 355/53 |

*Primary Examiner*—Georgia Epps
*Assistant Examiner*—Timothy Thompson
*Attorney, Agent, or Firm*—George O. Saile; Stephen B. Ackerman

[57] ABSTRACT

A mask pellicle removal methods for separating a mask pellicle from a glass reticle to which it is bonded by prying against its releasable bond. The methods includes a table support for nesting the glass reticle and for supporting a manually operated prying mechanism having only the necessary degrees of freedom for prying free the mask pellicle without damaging the glass reticle.

6 Claims, 5 Drawing Sheets

MASK PELLICLE REMOVE TOOL

BACKGROUND OF THE INVENTION (1) Technical Field

This invention applies generally to methods of photo-printing microcircuit patterns on photosensitive coated substrates used in the manufacture of semiconductor slices and more particularity, to a method and apparatus for removing a pellicle frame from a surface of a photomask consisting of an array of enlarged circuit patterns.

(2) Description of the Prior Art

The following three documents relate to various methods dealing with pellicle mounting apparatus.

U.S. Pat. No. 4,637,713 issued Jan. 20, 1987 to Shulenberger et al, discloses a pellicle mounting apparatus having a pair of pellicle holder assemblies positioned on either side of a photomask holder assembly.

U.S. Pat. No. 5,311,250 issued May 10, 1994 to Suzuki et al, shows another pellicle mounting apparatus.

U.S. Pat. No. 5,422,704 issued Jun. 6, 1995 to D.Sego discloses a pellicle frame.

A wafer for the manufacture of a semi-conductive elements is subjected to numerous sequenced operations which enable the fabrication of all its circuit elements. The use of a photo resist material in conjunction with photograhic masks provides the means to transfer the various pattern layers to the semiconductor wafer. The photo mask carries an enlarged pattern which is optically reduced upon each wafer's surface by projection printing. The layers upon which these images are to be reproduced are either a semiconductor, an oxide on a semiconductor, or a metal film covering the semiconductor.

The image formed in the photo resist can not be better than the photomask used to determine the exposed and unexposed areas. The most important characteristics that the image must possess are; dimensional correctness, uniform density in both clear and opaque areas, and sharp definition between clear and opaque areas.

In most applications, thousands of images are formed on a single photomask. A sequenced series of photomasks is required to complete a given semi-conductive device. Each mask controls the exposure of window patterns on wafers coated with photo sensitive resist material. This resist material is processed (developed) to wash away the exposed resist which permits access through the windows for depositing, implanting, or etching a variety of materials.

Multiple mask images which make up a mask series are produced with a defined, closely controlled spacing. In most semiconductor manufacturing operations, a series of photo-masks are required to produce finished semi-conductive devices. Since the series of masks are used sequentially, mask alignment and the center to center spacing between features produced by successive masks must conform to preceding mask images to form a coherent array of materials in the layers of the devices being built.

It is well known that during the manufacture of semiconductive devices the goal is to achieve defect free exposures of circuit patterns. As integrated circuits evolved from small scale integration to very large scale integration the need for ultra clean manufacturing space became increasingly critical. As an example, a single airborne particle landing on the photomask surface during exposure can ruin the circuit exposed on the wafer below it.

To help solve this problem, the photolithographic industry developed pellicles to intercept particulates and protect the surfaces of photomasks against all forms of contamination. Pellicles include a thin, transparent membrane stretched across a frame. The frame holds the membrane in tension and keeps it away from the mask surface by the thickness of the frame. An adhesive is used to bond the frame to a surface of the photomask.

Because of the obvious inherent simplicity of this device, it has found use over a very wide range of the electromagnetic spectrum. The pellicle concept has been used in the optical industry for many years. A transparent membrane would have the effect of increasing the number of wavelengths in an optical path, or as a beam splitter in interferometry. Its application has been extended to photolithography by intercepting dust particles and other contaminents from reaching the focal plane of photomasks.

Many difficulties have been fronted in properly removing pellicle assemblies from photomasks. This procedure is necessary when cleaning or replacing damaged pellicle membranes. Presently, this job is done manually with the aid of simple hand tools and a stereomicroscope. Techniques for removing pellicle assemblies from photomasks vary widely. Each technician developes their own procecure and craftiness therefore, at times, cause costly miscues.

SUMMARY OF THE INVENTION

It is a primary object of the present invention to provide apparatus for removing pellicle assemblies from a photomask without damaging the photomask's image quality.

Another object of the present invention is to standardize the removal process of pellicle assemblies by eliminating the crafty dependance of an operator.

In accordance with the objects of this invention, a new method and apparatus is provided to standardize the removal of pellicle assemblies from photomasks. This invention describes an apparatus that requires less skill and training with little chance of damaging the photomask or producing inbedded particulates on the plane of the mask's circuit pattern causing repeating shorts or opens during a wafer's exposure process.

Briefly, the invention describes a mechanical apparatus that permits only the degrees of freedom necessary for removing the pellicle assembly from the photomask. The mechanical apparatus is positioned inline with a pellicle/photomask nesting station. A mask is placed within the nesting station, the apparatus is then moved towards the pellicle/photomask assembly until a pair of prying arms come into contact with adjacent corners of the pellicle at the bonded interface between the pellicle frame and photo mask. The materials making contact with the pellicle assembly and photomask especially in the area of prying are delicate in composition and non-obtrusive to the photomask's glass surface.

DETAILED DESCRIPTION OF THE PREFERRED EMBODIMENT

Figure 3:
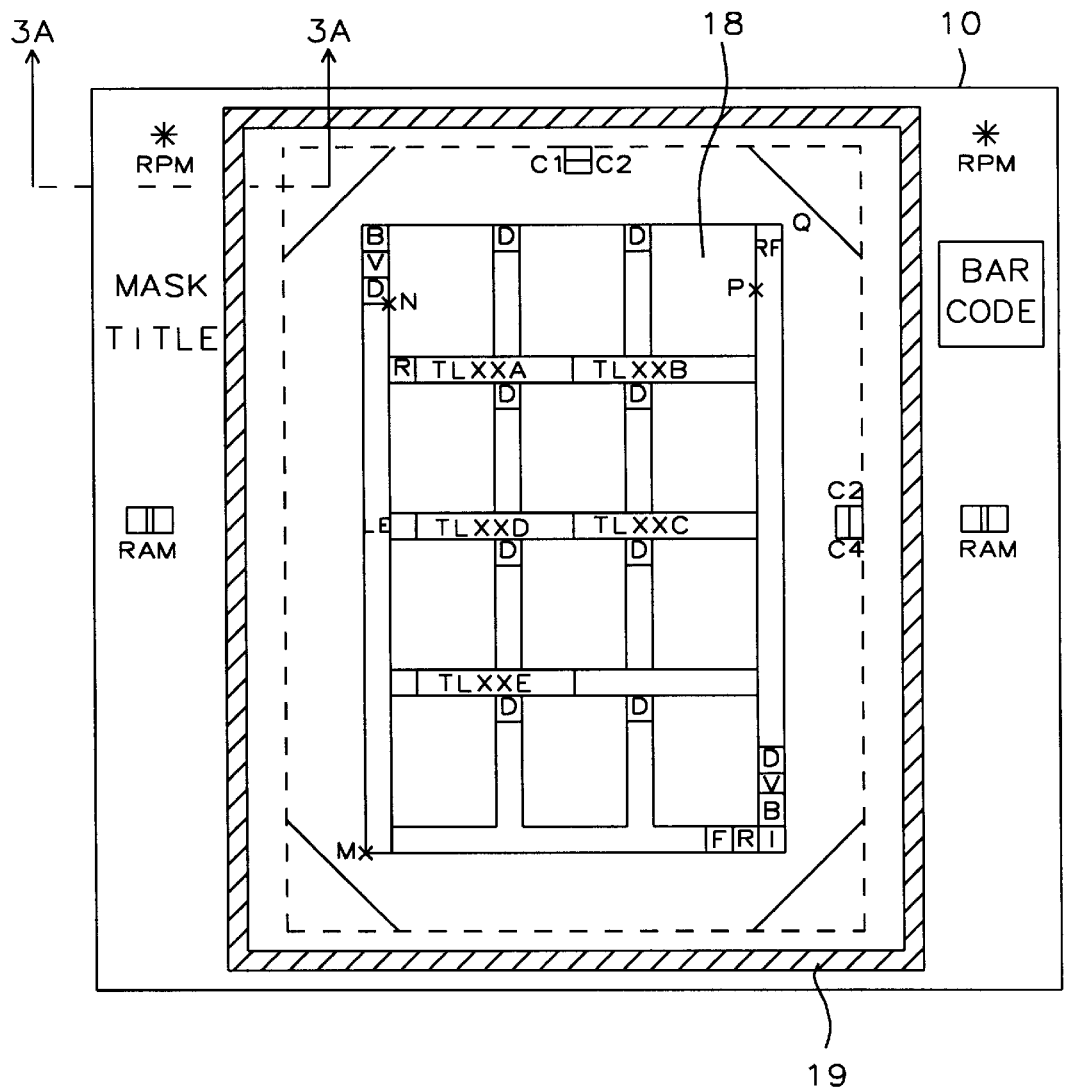
FIG. 3 is a top view of a typical 5× photomask, of the prior art, with a mask pellicle in place showing a layout of an array of reticle cells.
Figure 3A:
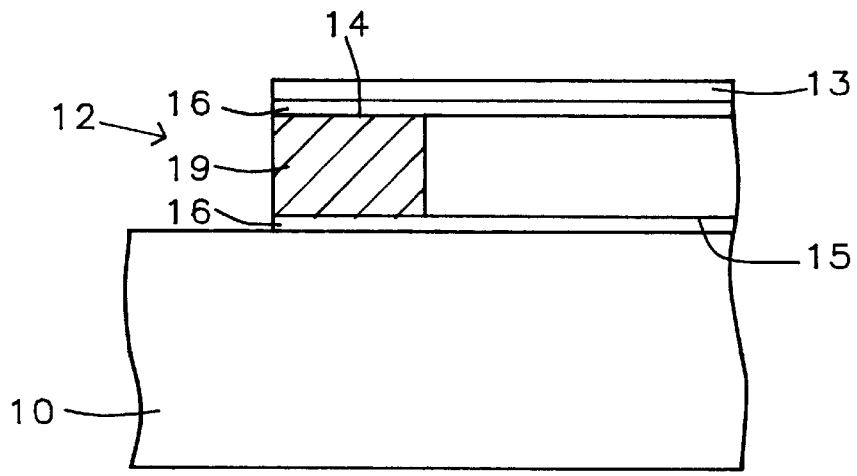
FIG. 3A is a fragmentary view of an attached mask pellicle of the prior art.

An embodiment of the present invention will be described with reference to the drawings. Referring briefly to FIGS. 3 and 3A an array of reticle cells 18 is etched through a thin metal plating deposited on the surface of a glass substrate 10 and protected from particulates and other forms of contamination by a pellicle frame assembly 12. Assembly 12 consists of an aluminum frame 19 with a pellicle membrane 13 having an anti-reflection coating thereof. The pellicle membrane is stretched and adhered with an adhesive 16 to the top surface 14 of frame 19 effecting a transparent and protective top enclosure. Assembly 12 is placed on the glass substrate and aligned to encompass the reticle array. The bottom edge of the aluminum frame 15 is bonded with adhesive 16 to the image side of the glass substrate. The bonding of the pellicle membrane to the aluminum frame and the pellicle frame assembly to the glass reticle is done off line, and prior to a lithographic exposure.

All references to the pellicle frame assembly will hereafter be referred to as mask pellicle.

The present invention is utilized when the mask pellicle requires cleaning or is damaged. The bonded mask pellicle must be removed from the glass photomask without damaging the reticle pattern.

Figure 1:
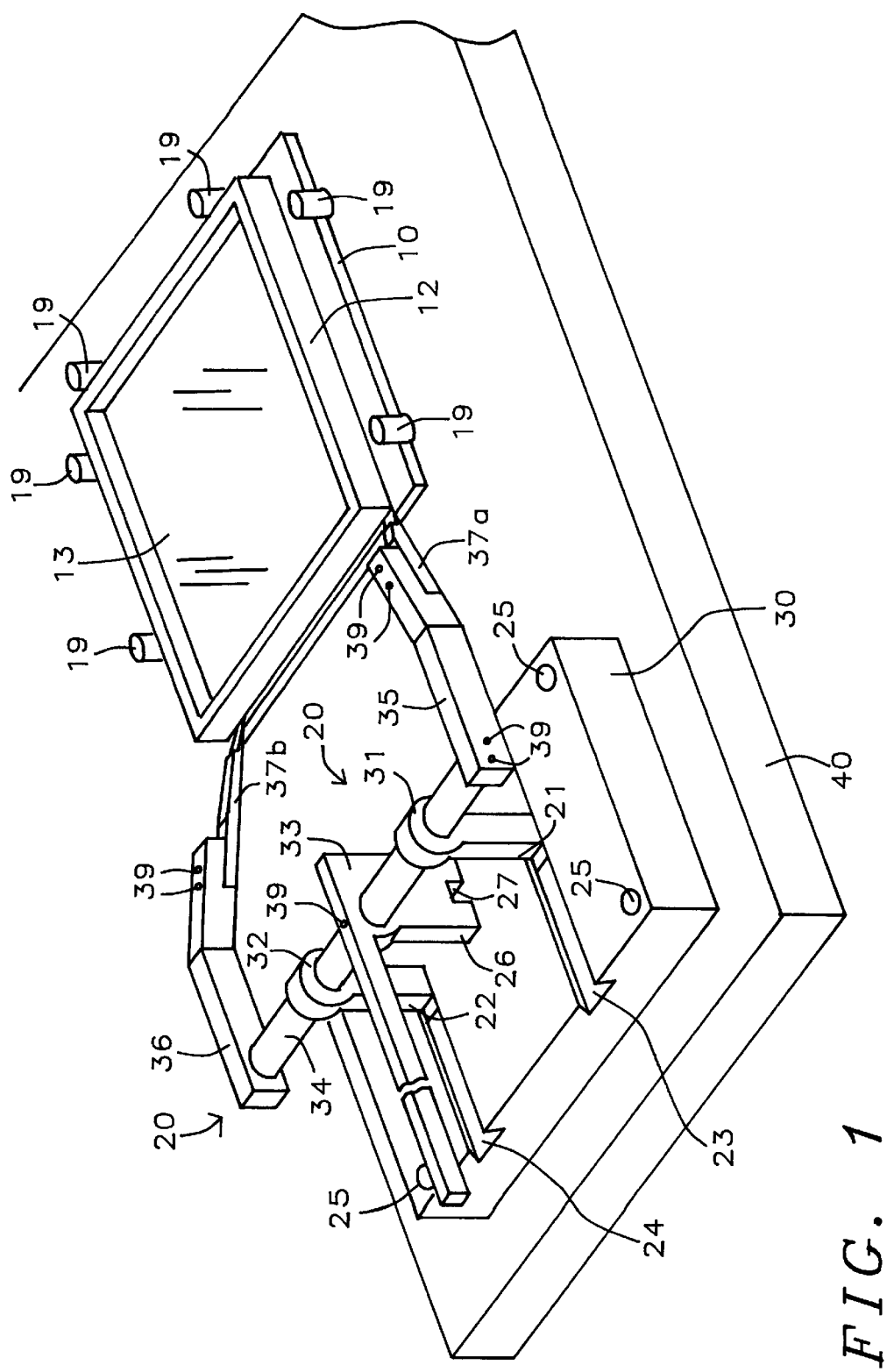
FIG. 1 is an isometric view of the present invention shown in its working position for removing a mask pellicle.
Figure 1A:
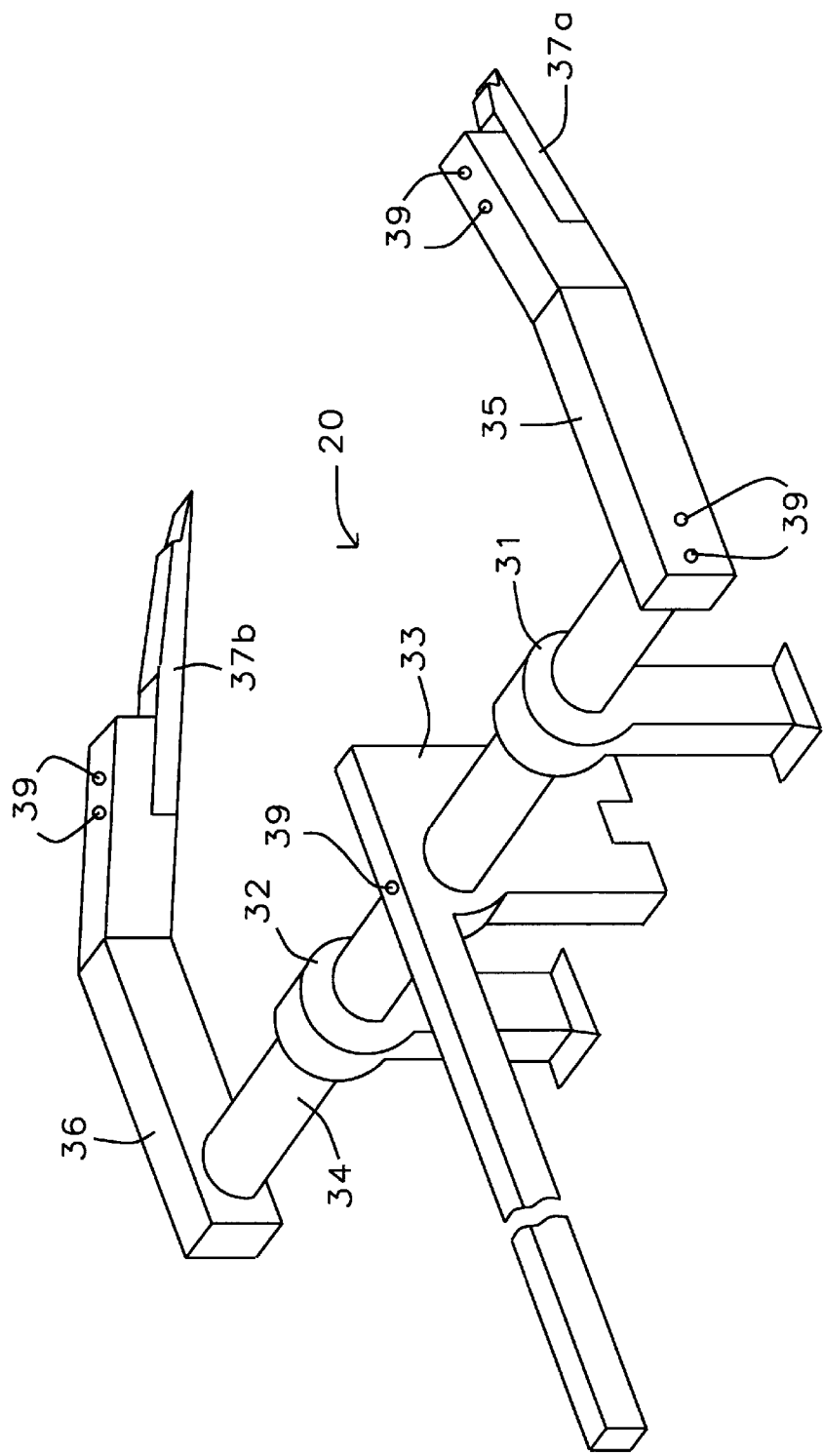
FIG. 1A is an isometric view of the present invention illustrating the upper mask pellicle removal apparatus.

FIGS. 1 and 1A are illustrations showing a mask pellicle removal apparatus according to the embodiment. With reference to FIG. 1, a base 30 is a heavy, flat plate which provides stability for a prying mechanism 20 shown in FIG. 1A. A pair of bearing plates 21 and 22 having one end slidably engaged with parallel dovetail guides 23 and 24 are spaced apart and recessed in the base said bearing plates extend upward to a rotatable shaft 34 which is transversely placed through journal bearings 31 and 32 located at the other end of the bearing plates. L shaped Lever 33 is disposed intermediate the bearing plates and the horizontal lever member fixed horizontally to the pivot shaft with a locking screw 38. The vertical member of the lever is bifurcated to limit the lever rotation by the space between members 26 and 27 with base 30. Making member 26 shorter relative to member 27 permits a greater downward rotation of the horizontal member. A right arm 35 and a left arm 36 are each mounted with two screws 39 at opposite ends of the pivot shaft. The arms designed to converge downward are mounted parallel to each other on opposite ends of the pivot shaft and extend forward horizontally to midway its length are then angled downward while converging as best illustrated in FIG. 1. Blade insert 37a is mounted with two screws 39 to the forward end of arm 35 and blade insert 37b is mounted with two screws 39 to the forward end of arm 36. The blade inserts are made of a teflon base material, polyvinylidenefluoride, having sufficient strength for prying off the mask pellicle from the glass reticle yet resilient not to cause damage to the glass or reticle array. The blade inserts are shaped to fit under a recessed front portion of the arms, and tapered in two steps. The first step is to allow visual access for positioning of the blade inserts towards the bottom edge of the mask pellicle and the second tapered step forms a sharp edge that is used for prying the mask pellicle from the glass reticle.

Base 30 with the manually operated prying mechanism that is used to remove the mask pellicle is positioned, aligned, and secured to a table surface 40 with 4 corner screws 25 behind a pattern of raised dowel pins 19 pressed into a plurality of holes in the table surface forming a bordered nest for the glass reticle as illustrated in FIG. 1.

Figure 4:
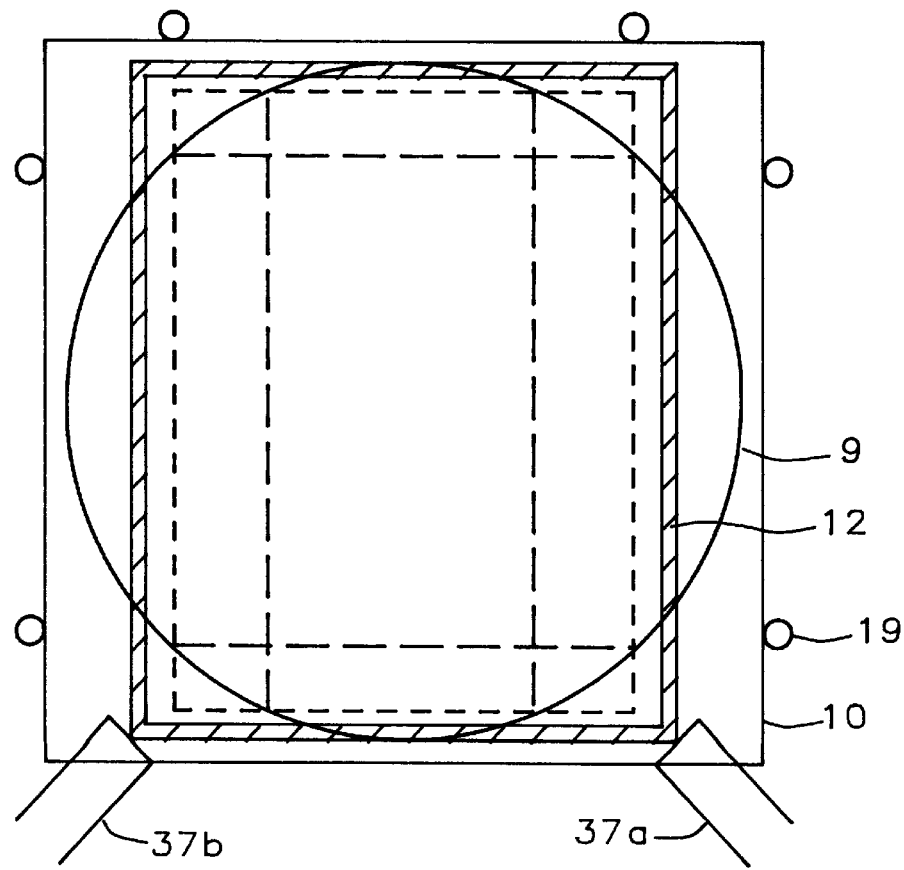
FIG. 4 is a top view representation of a six inch, 5× photomask showing the lens image exposure area relative to the pellicle frame.

FIG. 4 shows the positions of blade inserts 37a and 37b relative to the reticle pattern and the edge of the glass reticle. As pictured, the operating space for removing the mask pellicle is limited by both the glass edge at the outside of the frame and the reticle pattern at the inside of the frame. Care must be taken to avoid damage to the reticle pattern and the glass surface.

During photolithography, an exposing apparatus is used in semi-conductor manufacturing. A lens exposure field 9 is shown in FIG. 4 during a typical exposure of a pellicle shielded retical array.

Figure 2:
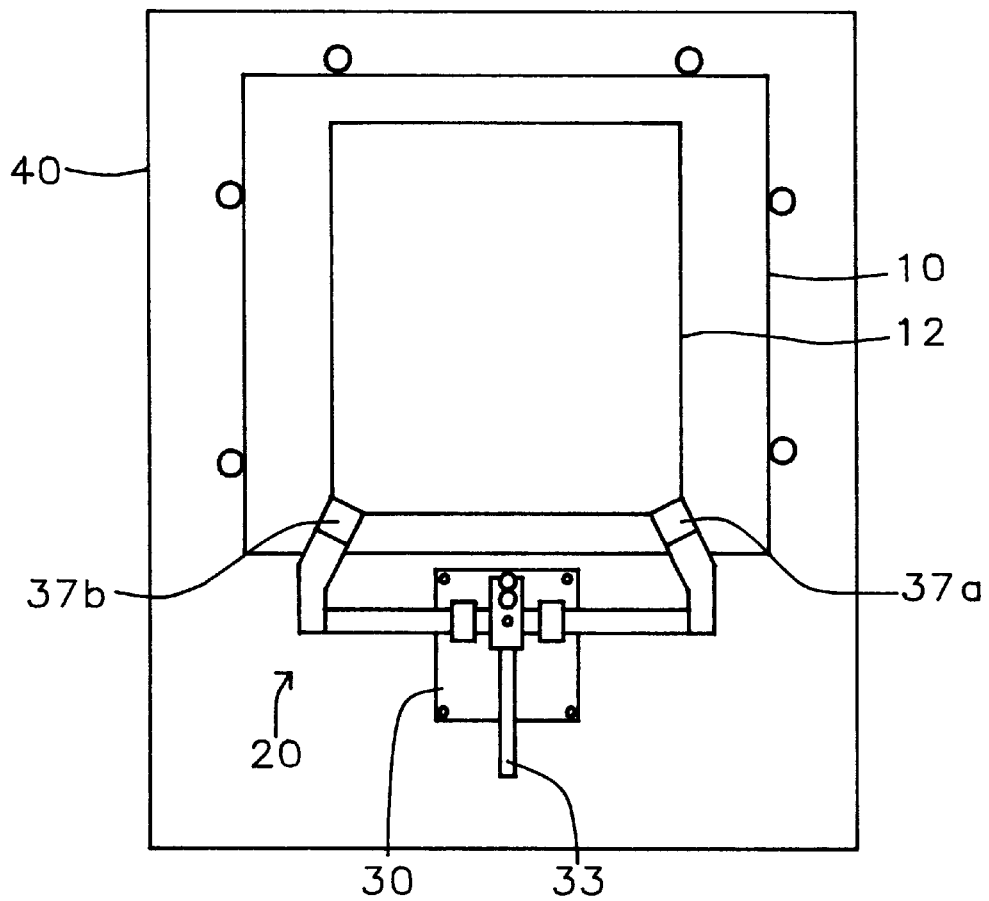
FIG. 2 is an abbreviated top view illustration of the present invention.

The operating procedure for the use of apparatus 20 will be discussed with primary reference to FIGS. 1 and 2. The procedure begins with the placement of the glass reticle 10, with its mask pellicle attached, onto a table 40 within a bounding location defined by pins 19. Lever 33 is depressed to lift the blade inserts above the top surface of the glass reticle while the upper portion of assembly 20 is moved slidably towards the mask pellicle while lowering the blade inserts to gently rest on the glass reticle until contact is made between the blade inserts and the bottom edge of the mask pellicle. Forward pressure is applied to the upper assembly 20 while depressing lever 33. The pressure angle imposed on the bottom edge of the mask pellicle by the blade inserts and its angle of rotation will generate shear and tensile force components sufficient to dislodge the adhesion bond between the mask pellicle and glass substrate. The mask pellicle is then carefully lifted away from the glass reticle. Both translating and rotating motions are limited by preset mechanical stops, not shown, to avoid overtravel that may excessively push or lift the loosened mask pellicle thereby causing damage to the unprotected reticle pattern or to the glass surface.

While the invention has been particularly shown and described with reference to the preferred embodiments thereof, it will be understood by those skilled in the art that various changes in form and details may be made without departing from the spirit and scope of the invention.

What is claimed is:

1. A method of separating a mask pellicle from a glass reticle to which it is bonded by prying a releasable bond without damaging said glass reticle, comprising the steps of:
   a) positioning said glass reticle with mask pellicle attached onto a table support surface and within a nesting pin pattern contained on said table support surface;
   b) using a manual prying mechanism slidably mounted on said table support surface and behind said nesting pin pattern said manual prying mechanism comprising an inverted L shaped lever handle fixedly mounted midway and behind a transversely mounted shaft, said shaft is axially rotatable within bearing means of sliding member, said shaft having an arm mounted to each end and in a forward direction, said arms containing resilient blade inserts at its forward ends used for prying;
   c) depressing the lever handle to lift the blade inserts above the mask reticle surface; while,
   d) pushing the manual prying mechanism towards the mask pellicle; and,
   e) gently lowering the lever handle to rest the blade inserts on the glass reticle surface and against both lower corners of the mask pellicle;

f) forcing the lever handle forward and upward until the mask pellicle is separated from its bond;

g) gently lift the mask pellicle from the glass reticle surface.

2. The method of claim 1 wherein manually depressing an inverted L shaped lever lifting a pair of blade inserts, rotatably coupled to said inverted L shaped lever, onto said glass reticle while pushing and directing said inverted L shaped lever to lower said blade inserts towards the bonded interface of said glass reticle and mask pellicle.

3. The method of claim 1 wherein pushing and directing said inverted L shaped lever are limited in translation and rotation to prevent overtravel of said blade inserts thereby reducing potential damage to said glass reticle.

4. The method of claim 1 wherein forcing said blade inserts forward and upward destroys the bonding hold of the adhesive that is low in both shear and tensile strength.

5. The method of claim 1 wherein said inverted L shaped lever having a vertical member with two lower fingers consisting of different lengths for interfering with a supporting base surface thereby limiting rotation of said shaft.

6. The method of claim 1 wherein said blade inserts are made from polyvinylidenefluoride, a teflon base material, with adequate mechanical properties for prying the mask pellicle from a glass reticle yet sufficiently resilient not to damage said glass reticle or its pattern.

* * * * *